United States Patent
Ho et al.

(10) Patent No.: US 7,749,904 B2
(45) Date of Patent: Jul. 6, 2010

(54) METHOD OF FORMING A DUAL DAMASCENE STRUCTURE

(75) Inventors: Bang-Chein Ho, Hsinchu (TW); Jian-Hong Chen, Hsinchu (TW); Da-Jhong Ou Yang, Taipei Hsien (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 530 days.

(21) Appl. No.: 11/748,574

(22) Filed: May 15, 2007

(65) Prior Publication Data

US 2007/0212877 A1    Sep. 13, 2007

Related U.S. Application Data

(62) Division of application No. 10/789,083, filed on Feb. 27, 2004, now Pat. No. 7,241,682.

(51) Int. Cl.
    *H01L 21/44* (2006.01)
(52) U.S. Cl. .......... 438/672; 438/673; 438/637; 438/700; 438/618
(58) Field of Classification Search ......... 438/612–624, 438/637–638, 700–706, 672–673
    See application file for complete search history.

(56) References Cited

U.S. PATENT DOCUMENTS

| 6,013,581 | A | 1/2000 | Wu et al. |
|---|---|---|---|
| 6,057,239 | A | 5/2000 | Wang et al. |
| 6,268,283 | B1 | 7/2001 | Huang |
| 6,350,681 | B1 | 2/2002 | Chen et al. |
| 6,365,529 | B1 | 4/2002 | Hussein et al. |
| 6,514,860 | B1 | 2/2003 | Okada et al. |
| 6,767,833 | B2 * | 7/2004 | Shih et al. ............ 438/706 |
| 6,861,347 | B2 | 3/2005 | Lee et al. |

OTHER PUBLICATIONS

Ding et al., "Optimization of Bottom Antireflective Coating Materials for Dual Damscene Process" SPIE Proceedings, 3999 (2000), pp. 910-918.

Pollentier et al., "Dual Damascene Back-End Patterning Using 248 nm and 193 nm Lithography" Interface 2000, pp. 265-283.

Gadson et al., "Top Surface Imaging Improves Copper Process Resolution" Solid State Technology, pp. 1-5, 77 (2001).

* cited by examiner

*Primary Examiner*—Dung A. Le
(74) *Attorney, Agent, or Firm*—Thomas, Kayden, Horstemeyer & Risley

(57) ABSTRACT

An improved method of forming an integrated circuit that includes a dual damascene interconnect is described. A contact via hole is formed in a dielectric layer disposed above a semiconductor substrate. A protective layer is disposed on top of the dielectric layer and in the contact via hole, and subsequently forming as a recessed plug in the via, followed by etching to form a trench to complete formation of a dual damascene opening.

6 Claims, 6 Drawing Sheets

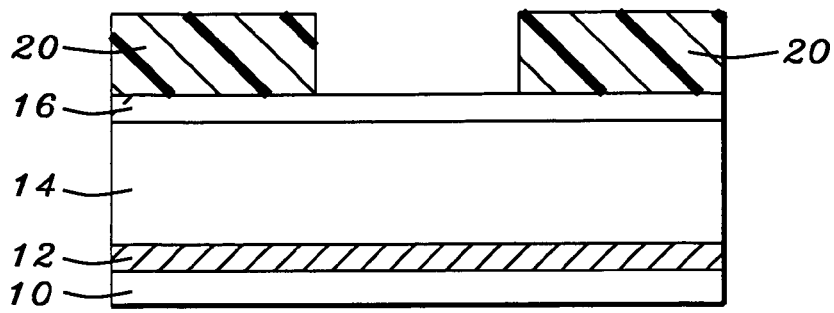
FIG. 1A – Prior Art
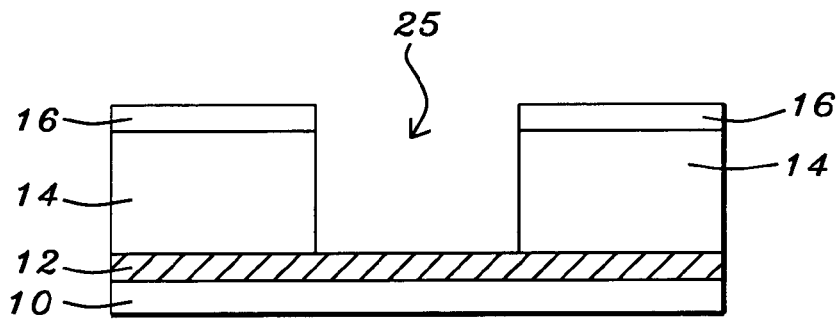
FIG. 1B – Prior Art
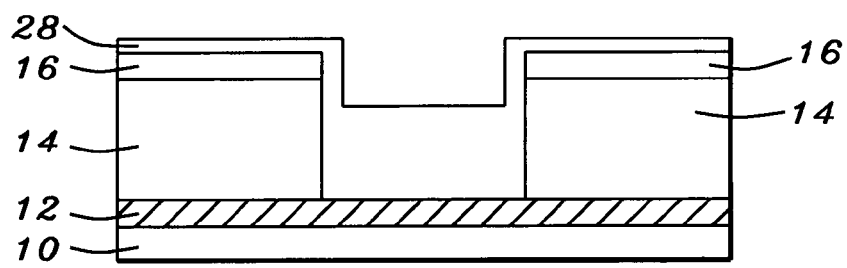
FIG. 1C – Prior Art
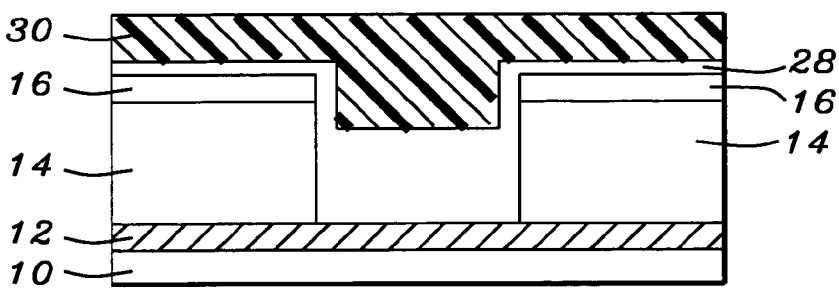
FIG. 1D – Prior Art

METHOD OF FORMING A DUAL DAMASCENE STRUCTURE

CROSS-REFERENCE TO RELATED APPLICATION

This application is a divisional of U.S. patent application Ser. No. 10/789,083, filed Feb. 27, 2004, which is incorporated herein by reference.

FIELD OF THE INVENTION

The present invention relates generally to an improved method of forming multilayer interconnects and more specifically to a method for a dual damascene structure that uses a developing antireflective layer for protecting the contact hole during the damascene etch process.

BACKGROUND OF THE INVENTION

A dual damascene process is a technique used to form interconnects in an insulator layer. Typically, the insulator layer is patterned to form vias and trenches. The vias and trenches are filled with metal to form conducting wires and via plugs. The conventional dual damascene process is described in Licata et al., "Dual Damascene Al Wiring for 256 M Dram", *VCIM Conference* 1995, pgs-596-602. For example, a via hole is first etched, followed by the etching of a trench overlying the via opening. Disadvantages of the dual damascene process include the unevenness of the resist coating and the reflectivity from the substrate which distorts the resist image. In addition, the photoresist inside the via hole is removed prior to etching the trench so that no protection layer is present for the subsequent trench etch step. Thus, there is damage to the layer underlying within the via hole.

U.S. Pat. No. 6,365,529 to Hussein et al., reveals a method for forming dual damascene copper interconnects using a reactive ion etching of a sacrificial layer that fills the previously formed contact hole. U.S. Pat. No. 6,350,681B to Chen et al., reveals a dual damascene process that uses a chemical mechanical polishing process to remove the barrier layer material outside the via holes. U.S. Pat. No. 6,268,283B1 to Huang discloses a transparent spun on cap layer underneath the resist to prevent damage by the developer to the dielectric underlayers. U.S. Pat. No. 6,013,581 to Wu et al., discloses a dual damascene process that includes a plasma treatment of the exposed dielectric layer below the opening before the openings are filled with conductive material. U.S. Pat. No. 6,057,239 to Wang et al. discloses a damascene process that includes a plasma treatment of the exposes a portion of the oxide layer by using reactive ion etchback of the antireflective layer that filled the contact hole. The oxide layer is then wet etched to form the wiring trough.

Some papers have been published that reflect on the issues of conventional dual damascene and these include using a BARC (bottom antireflective layer) layer such as in Ding et al., "Optimization of Bottom Antireflective Coating Materials for Dual Damascene Process", *SPIE Proceedings*, 3999, 910-918 (1999), Pollentier et al., "Dual Damascene back-end Patterning using 248 nm and 193 nm Lithography," *Interface* 2000, pgs 265-284 (2000) and Gadson, *Solid State Technology*, pg. 77 (2001).

The dual damascene process using a single layer of photoresist with no BARC suffers from reflectivity issues or line width dependency on thickness of the resist. Attempts to solve this problem include using a BARC under the resist. FIG. 1A illustrates a conventional dual damascene process using a BARC layer. Semiconductor device structures, not shown, may be formed in and on semiconductor substrate 10. One of these structures is to be contacted by a dual damascene interconnect. An etch stop layer 12 is deposited over the surface of the substrate.

A first thick insulator layer 14 is deposited over the etch stop layer 12. A second insulator layer 16 may be deposited over the insulator layer 14. 16 may be a hard mask layer. A layer of photoresist 20 is patterned to form a via hole opening as shown. IF a hard mask is used, the via pattern is transferred to the hard mask 16 and the photoresist 20 is removed. The insulator layer is etched to form a via opening 25 as shown in FIG. 1B.

Now, as shown in FIG. 1C, a layer of organic bottom antireflective layer (BARC) 30 is coated over the substrate and filling the via opening. A second photoresist layer 30 is coated over the substrate, as illustrated in FIG. 1D. The photoresist is patterned as shown in FIG. 1E to form a trench opening 35. Using the remaining resist as an etch mask and the BARC as a protection sublayer for etch stop 12, the insulating layers are etched to form the dual damascene opening as shown in FIG. 1F. The resist and BARC are stripped and the dual damascene opening is filled with metal 38 as shown in FIG. 1G.

The BARC process of the prior art can introduce "fence-like" etching resides 29. The fence-like structures are believed to arise if the BARC thickness on the sidewall of the via opening, as shown in FIG. 1C, is too thick or if the BARC is not recessed below the trench stop layer. This is becaused the BARC etch rate is too low in an oxide or low dielectric constant (k) material etch process. Another issue that may arise during imaging is that materials may diffuse from the insulating layer 14 into the resist 25, causing so-called poisoning of the resist. This can cause a positive resist to form an insoluble interfacial layer to residues in the image of the via hole pattern.

SUMMARY OF THE INVENTION

Accordingly, it is an object of the present invention to provide an improved method for dual damascene interconnect structures in the fabrication of integrated circuits.

Another object of the present invention is to provide a method for forming a dual damascene structure that may provide superior via and trench profiles which are substantially free of defects.

A further object of the invention is to provide a method that overcomes poisoning at the interface of the resist image.

Yet another object of the invention is to provide a structure that protects underlying layers during trench etching.

Still another object of this invention is to provide for a dual damascene process having a recessed plug formed by an antireflective coating material.

The above and other objects of the present invention may be accomplished by a dual damascene process including the steps of forming a contact via hole in an dielectric layer disposed above a semiconductor substrate, disposing a protective layer on top of the dielectric layer and in the contact via hole, and subsequently forming a recessed plug in the via, followed by etching to form a trench to complete formation of a dual damascene opening.

The dual damascene process according to the invention comprises providing a substrate having a first etched region therein. The first etched region is filled with a bottom antireflective coating (BARC) layer. A resist layer is coated over the BARC layer. The resist layer and the BARC layer are patterned to define an opening encompassing the first etched opening wherein the BARC layer is recessed within the first etched opening. Thereafter, second etched region is formed encompassing a top portion of the first etched region. Thereafter, the resist layer and the BARC layer are removed and the first and second etched regions are filled with a conductive material to complete formation of the interconnect.

Also, the dual damascene process according to the invention comprises providing a substrate having a first etched region therein. The first etched region is filled with a first protective layer. The first protective layer is etched back to form a recessed plug within the first etched opening. The substrate and the recessed plug are coated with a second protective layer. The second protective layer is coated with a resist layer. The resist layer and the second protective layer are patterned to define an opening encompassing the first etched opening wherein the second protective layer within the opening is removed and wherein the first protective layer remains within the first etched opening. Thereafter, a second etched region is formed encompassing a top portion of the first etched region. The resist layer and the first and second protective layers are removed and the first and second etched regions are filled with a conductive material to complete formation of a dual damascene interconnect.

Additional objects, features and advantages will be set forth in the description of preferred embodiments which follows.

BRIEF DESCRIPTION OF THE DRAWINGS

The present invention will be more clearly understood from the following description taken in conjunction with the accompanying drawings in which like reference numerals designate similar or corresponding elements, regions and portion in which:

FIGS. 1A through 1H illustrate in cross-sectional representation a prior art dual damascene process including BARC layer.

DETAILED DESCRIPTION OF THE PREFERRED EMBODIMENTS

The dual damascene process with improvements in profile are shown in FIG. 2A-2G and FIGS. 3A-3I. The first preferred embodiment of the present invention will be described with reference to FIGS. 2A-2G.

Figure 1E:
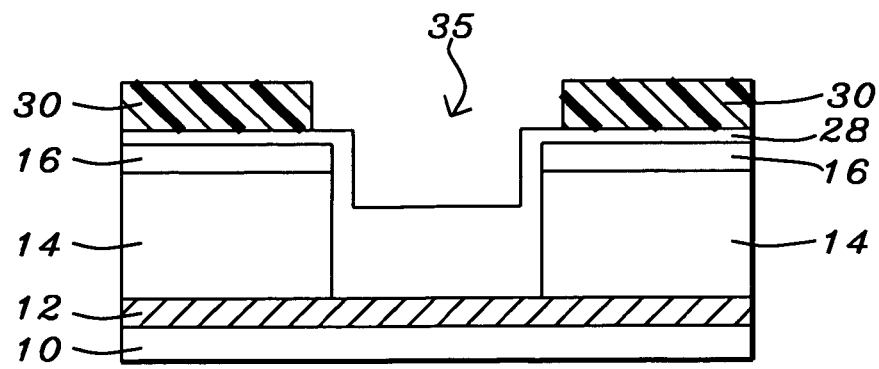
Figure 1F:
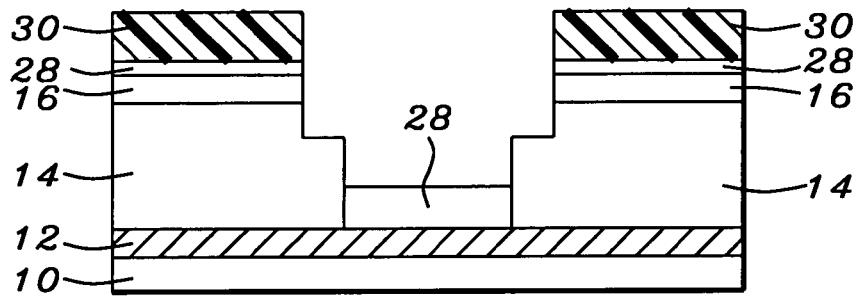
Figure 1G:
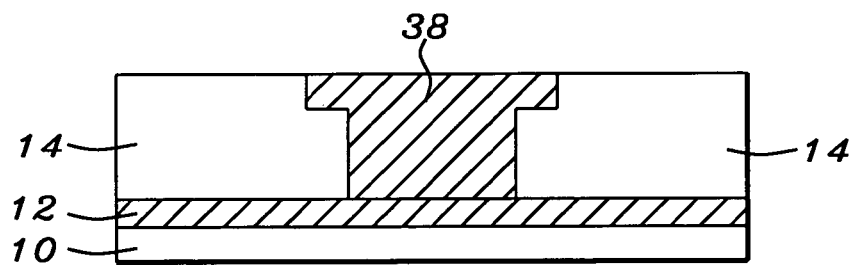
Figure 1H:
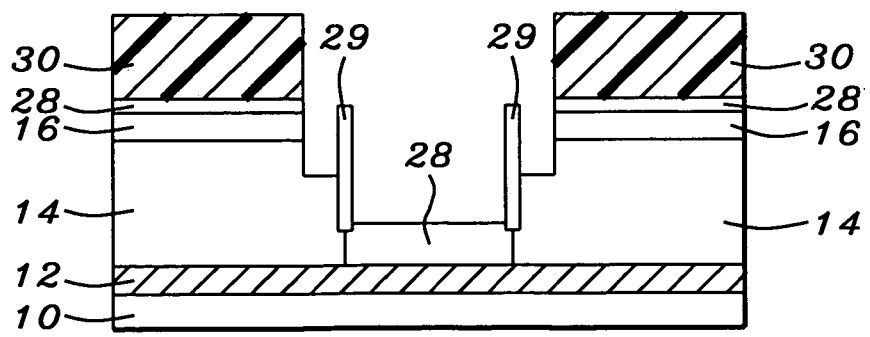
Figure 2A:
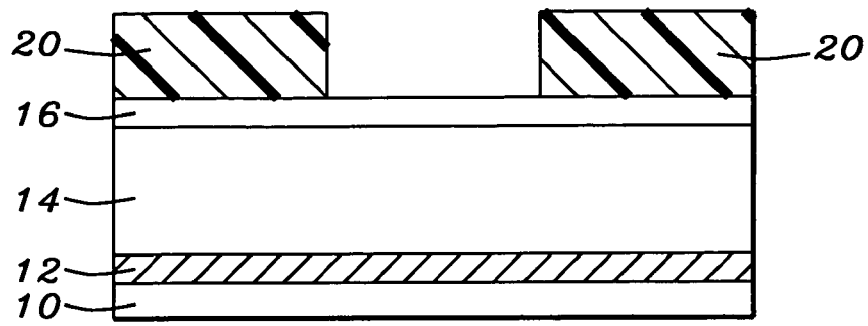
FIGS. 2A through 2G illustrate in cross-sectional representation a first preferred embodiment of the present invention.
Figure 2B:
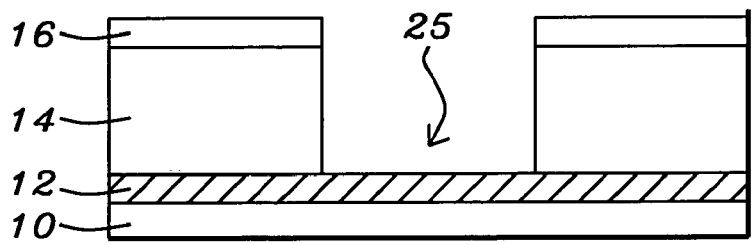

Referring now more particularly to FIG. 2A, there is shown a semiconductor substrate 10. Semiconductor device structures, not shown, may be fabricated in and on the semiconductor substrate. One of these structures is to be contacted by the dual damascene interconnect to be formed by the process of the invention. An etch stop layer 12 is deposited on the surface of the substrate. An insulating layer 14 is deposited over the etch stop layer. This may be an oxide, a low-k dielectric layer, or other insulating layer. A second insulating layer or hard mask layer 16 is deposited over the layer 14. For example, the hard mask layer may comprise silicon nitride. Patterned resist layer 20 is formed over the substrate having an opening for the via hole. Referring now to FIG. 2B, the pattern is transferred to the insulating layer 14 and 16 to form the via opening 25.

Figure 2C:
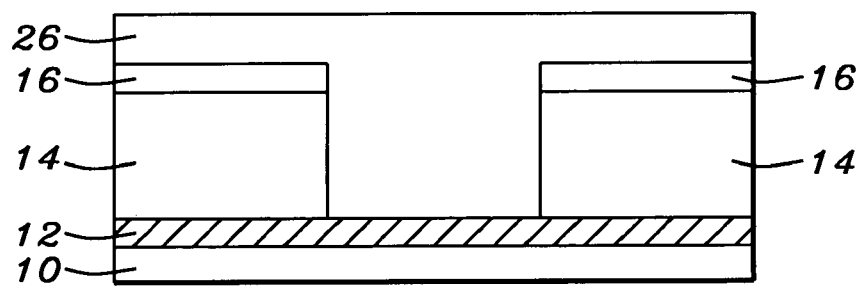

Now, in a key step of the present invention, a developable BARC (DBARC) layer 26 is coated over the insulating layers and within the via hole 25, as shown in FIG. 2C. The DBARC layer preferably filled the via hole 25. The DBARC material may be polyimide or an organic type ARC material. The developable BARC is developable in the photoresist developer such as an aqueous alkaline solution of 2.36% by weight tetramethyl ammonium hydroxide.

Figure 2D:
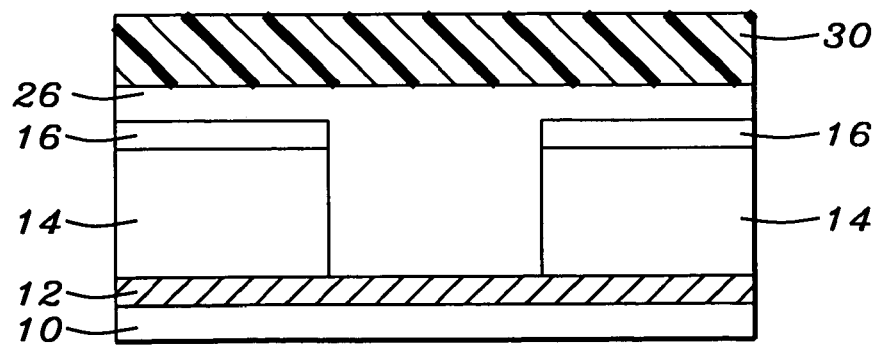
Figure 2E:
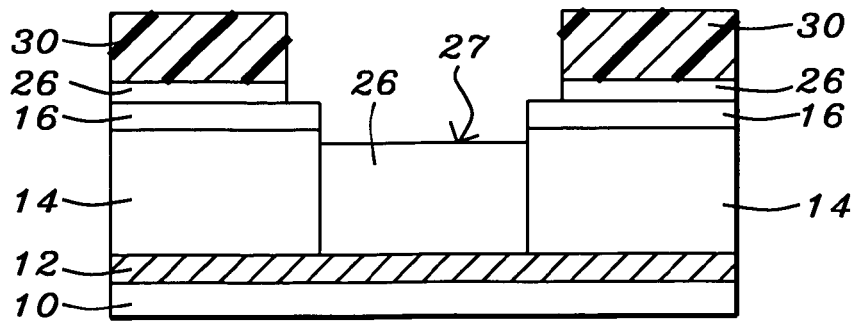
Figure 2F:
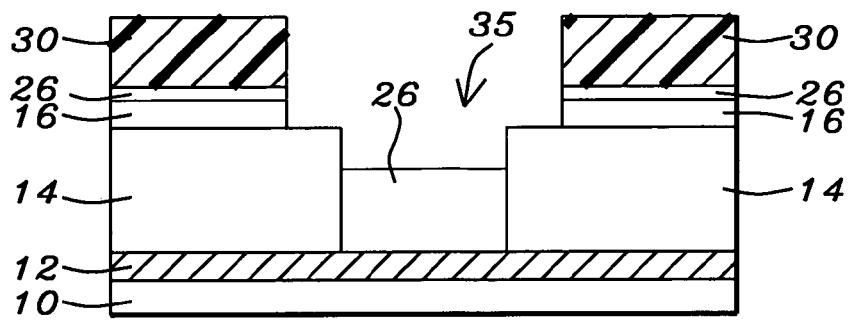
Figure 2G:
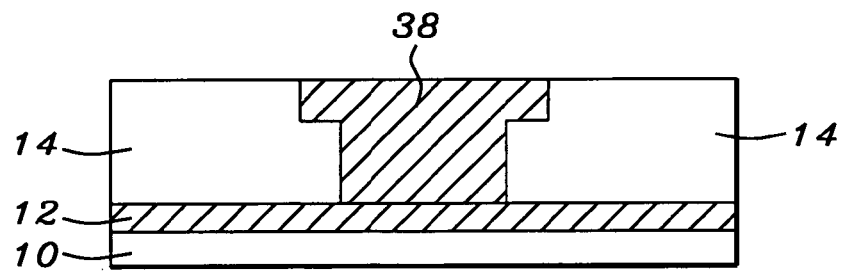

Referring now to FIG. 2D, a second resist layer 30 is coated over the DBARC layer 26. The resist and DBARC layer are patterned until a recessed plug 27 remains in the contact via hole 25 as shown in FIG. 2E. The recessed plug 27 has a height of between about 50% and 95% of the height of the via opening. Now, the trench opening 35 is formed by dry etching as shown in FIG. 2F. The resist 30 and DBARC material 26 are stripped. The dual damascene opening is filled with metal 38 to complete the dual damascene interconnect as shown in FIG. 2G.

Figure 3A:
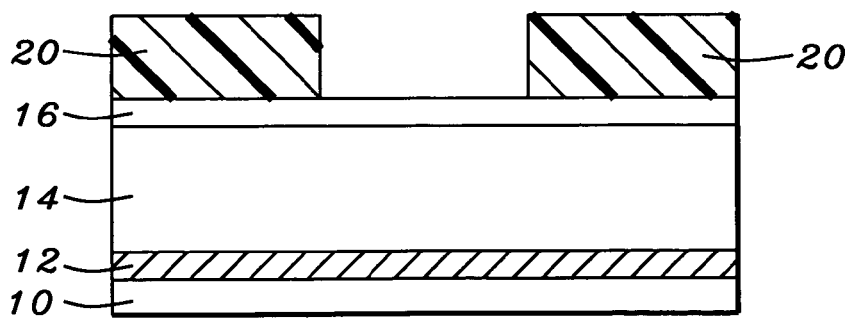
FIGS. 3A through 3I illustrate in cross-sectional representation a second preferred embodiment of the present invention.
Figure 3B:
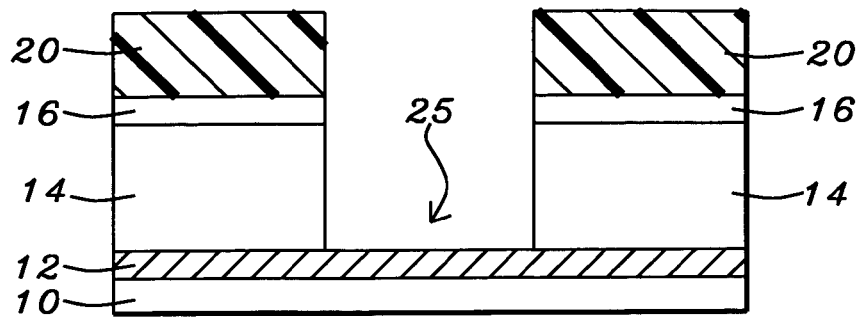

A second preferred embodiment of the present invention will be described with reference to FIGS. 3A-3I. Referring now more particularly to FIG. 3A, there is shown a semiconductor substrate 10. Semiconductor device structures, now shown, may be fabricated in and on the semiconductor substrate. One of these structures is to be contacted by the dual damascene interconnect to be formed by the process of the invention. An etch stop layer 12 is deposited on the surface of the substrate. An insulating layer 14 is deposited over the etch stop layer. This may be an oxide, a low-k dielectric layer, or other insulating layer 14. Patterned resist layer 20 is formed over the substrate having an opening for the via hole. Referring now to FIG. 3B, the pattern is transferred to the insulating layer 14 and 16 to form the via opening 25.

Figure 3C:
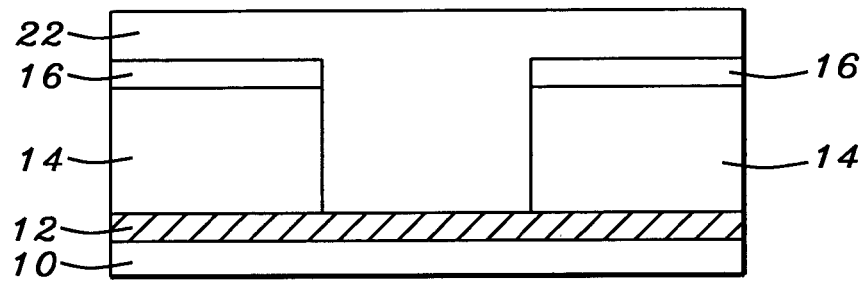
Figure 3D:
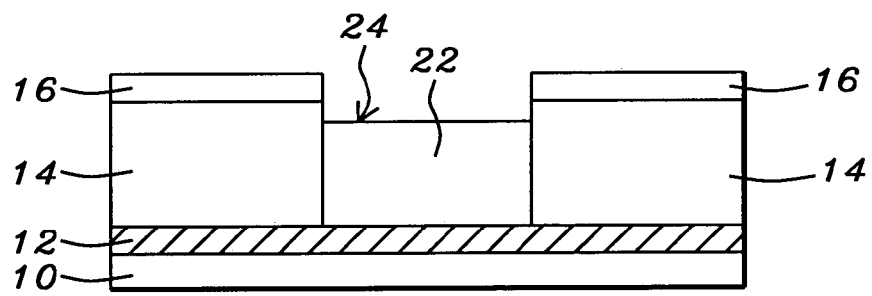

Now, in a key feature of the present invention, a high etch rate BARC or pure resin layer 22 is coated over the substrate and completely filling the via hole 25 as shown in FIG. 3C. The high etch rate BARC or pure resin is chosen so as to etch at least 25% faster than do the insulating layers 14 and 16. The BARC or resin also may absorb light at the same wavelength used to expose the photoresist. Now, the BARC or resin 22 is partially removed until the recessed plug 24 is formed as shown in FIG. 3D.

Figure 3E:
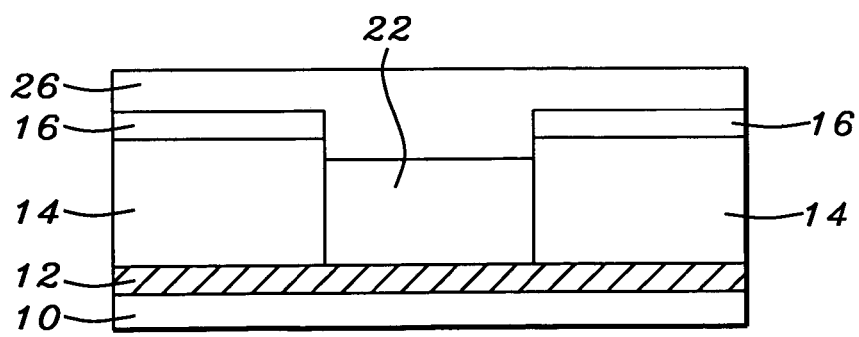

Referring now to FIG. 3E, a DBARC 26 is coated over the recessed plug 24. As in the first preferred embodiment, the DBARC 26 layer preferably fills the via hole 25. The DBARC material may be polyimide or an organic type ARC material. The developable BARC is developable in the photoresist developer.

Figure 3F:
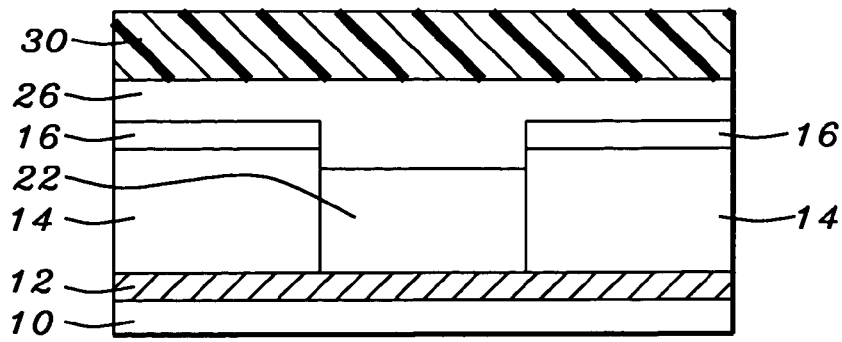
Figure 3G:
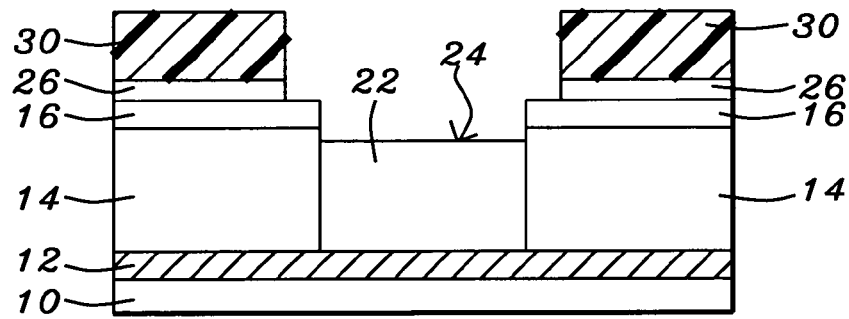

Referring now to FIG. 3F, a second resist layer 30 is coated over the DBARC layer 26. The resist and DBARC layer are patterned until the DBARC layer 26 within the opening is removed, leaving the high etch rate BARC or resin plug 24, as shown in FIG. 3G.

Figure 3H:
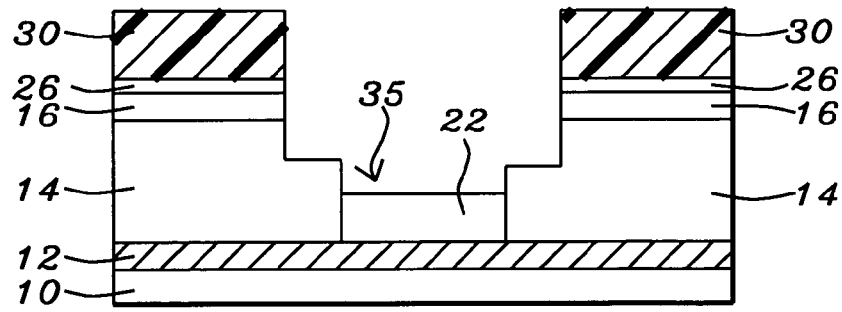
Figure 3I:
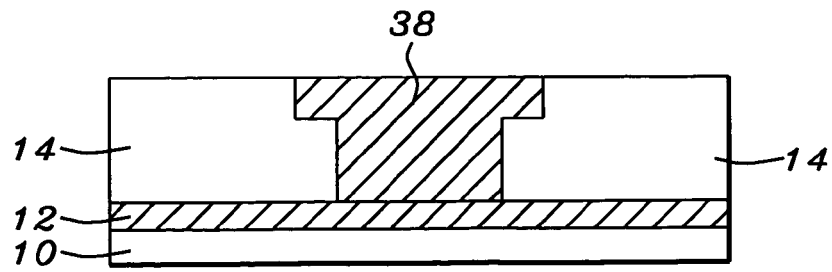

Now, the trench opening 35 is formed by dry etching as shown in FIG. 3H. The high etch rate BARC or resin is etched more quickly than the insulating layers 14 and 16. This prevents residue while protecting the underlying layer such as etch stop layer 12. The resist 30, DBARC 26, and BARC or resin material 22 are stripped. The dual damascene opening is filled with metal 38 to complete the dual damascene interconnect as shown in FIG. 3I.

Advantage of the Present Invention

The advantages of one or more embodiments of the present invention include providing a uniform thickness of the photoresist over A via topography by a planarizing antireflective sublayers prior to coating of the photoresist. Patterns generated in the resist are improved by the reduction of surface reflection and uniform resist thickness. The profiles of the trenches generated in the etch process are substantially improved and substantially free of defects. During the trench formation by etching, the BARC layer protects the underlying metal from damage by the plasma environment. During trench patterning by a resist process, the potential poisoning of the resist by diffusants that may arise from low k dielectric sublayers is avoided.

The present invention has been particularly described with respect to a dual damascene structure. It is understood that those skilled in the art can also apply the sequence of forming a recessed via plug, according to the preferred embodiments of the invention, to other patterned layers and configurations without departing from the spirit and scope of the invention. It is intended that the claims be interpreted to encompass the disclosed embodiments, those alternatives, and all equivalents thereto. While particular embodiments of the present invention have been illustrated and described, it is not intended to limit the invention, except as defined by the following claims.

What is claimed is:

1. A method of forming an integrated circuit having a dual damascene interconnect structure comprising:

providing a substrate having a first etched region therein;

filling said first etched region with a first protective layer, wherein said first protective layer is a BARC material having a high etch rate, and said high etch rate BARC material has the following properties: it may be etched at least 25% or more faster than layers through which said first and second etched openings are made; it completely fills said first etched region; and it absorbs light at a wavelength used to expose said resist;

etching back said first protective layer to form a recessed plug within said first etched opening;

coating said substrate and said recessed plug with a second protective layer;

coating said second protective layer with a resist layer;

patterning said resist layer and said second protective layer to define an opening encompassing said first etched opening wherein said second protective layer within said opening is removed and wherein said first protective layer remains within said first etched opening;

thereafter forming a second etched region encompassing a top portion of said first etched region;

thereafter removing said resist layer and said first and second protective layers; and thereafter filling said first and second etched regions with a conductive material to complete formation of said dual damascene interconnect.

2. The method according to claim 1 wherein said high etch rate BARC material comprises polyimide or organic type ARC material.

3. The method according to claim 1 wherein said first protective layer is a resin.

4. The method according to claim 1 wherein said second protective layer is a BARC material.

5. The method according to claim 4 wherein said BARC material has the following properties: it absorbs light at a wavelength used to expose said resist; it completely fills said first etched region; and it may be partially removed by a developer used to remove said resist.

6. The method according to claim 4 wherein said BARC material comprises polyimide or organic type ARC material.

* * * * *